# United States Patent [19]

Lee et al.

[11] Patent Number: 5,559,305
[45] Date of Patent: Sep. 24, 1996

[54] SEMICONDUCTOR PACKAGE HAVING ADJACENTLY ARRANGED SEMICONDUCTOR CHIPS

[75] Inventors: Chung W. Lee, Kyungki-do; Young J. Song, Tongdaemun-gu; Dong S. Seo, Mapo-gu; Jung II Park, Songbuk-gu, all of Rep. of Korea

[73] Assignee: Samsung Electronics Co., Ltd., Kyungki-do, Rep. of Korea

[21] Appl. No.: 296,596

[22] Filed: Aug. 29, 1994

[30] Foreign Application Priority Data

Aug. 27, 1993 [KR] Rep. of Korea ............... 16780/93

[51] Int. Cl.$^6$ ................................................ H01L 23/02
[52] U.S. Cl. .................... 174/52.4; 257/673; 361/760
[58] Field of Search ..................... 174/52.2, 52.4; 257/659, 666, 723, 668, 673, 685, 678, 787; 437/209, 219; 29/827, 825; 361/760

[56] References Cited

U.S. PATENT DOCUMENTS

| | | | |
|---|---|---|---|
| 4,937,656 | 6/1990 | Kohara | 357/70 |
| 5,138,438 | 8/1992 | Masayuki et al. | 357/75 |
| 5,206,536 | 4/1993 | Lim | 257/668 |
| 5,245,215 | 9/1993 | Sawaya | 257/676 |
| 5,296,737 | 3/1994 | Nishimura et al. | 257/673 |
| 5,303,120 | 4/1994 | Michii et al. | 361/760 |
| 5,334,803 | 8/1994 | Yamamura et al. | 174/52.4 |
| 5,349,233 | 9/1994 | Sasaki | 257/666 |
| 5,358,904 | 10/1994 | Murakami et al. | 437/209 |

Primary Examiner—Kristine L. Kincaid
Assistant Examiner—Robert J. Decker
Attorney, Agent, or Firm—Cushman Darby & Cushman, L.L.P.

[57] ABSTRACT

A single stacked semiconductor package has at least two semiconductor chips densely mounted via a lead on chip method for attaching leads of a lead frame by alternately arranging the leads over or under the semiconductor chips. A tape automated bonding method using thin metal leads formed on insulating tapes, and an adhesive coated on the lower portions of the leads to mount at least two semiconductor chips can also be used. A stacked semiconductor device manufacturing method and the semiconductor package according thereto are suitable for use in large scale integration circuits.

14 Claims, 4 Drawing Sheets

SEMICONDUCTOR PACKAGE HAVING ADJACENTLY ARRANGED SEMICONDUCTOR CHIPS

BACKGROUND OF THE INVENTION

1. Field of the Invention

The present invention relates to a stacked semiconductor chip package, and more particularly to a stacked semiconductor device and a semiconductor chippackage for adopting the same, wherein either a lead on chip method (hereinafter referred to as "LOC") that bonds leads onto semiconductor chips is employed to alternately arrange the leads of a lead frame to partially coincide with each other on the upper or lower portions of semiconductor chips, or a tape automated bonding ("TAB") method that uses thin metal leads formed on insulating tapes is employed, thereby densely mounting at least two semiconductor chips.

2. Background of the Prior Art

Generally, semiconductor chips of integrated circuits (ICs) or large scale integration (LSI) circuits are mounted on a metal lead frame, and encapsulated with a resin to be mounted on a printed circuit board (PCB). A manufacturing process of a typical resin-encapsulated package will be described below.

A semiconductor chip is mounted on a rectangular die pad punched into a metal lead frame by a predetermined interval via a predetermined method, e.g., a thermo-compression method by means of an adhesive such as Silver (Ag) or epoxy. One end of leads formed along the die pad are wire bonded to be connected to electrode pads of the semiconductor chips. Here, the die pad is supported by at least one tie bar. A package body is formed to wrap the semiconductor chip and wire for providing environmental protection by means of a molding member, e.g., an epoxy molding compound (hereinafter referred to as "EMC") via a common molding process.

In connection with the general resin-encapsulated semiconductor package, high density mounting within a smaller PCB area can be realized by forming thin and minimized packages as being strived for and advanced. However, the mounting density cannot be improved over a certain level. Therefore, a chip on board method (hereinafter referred to as "COB") for directly mounting the semiconductor chips on the PCB, a stacked package method for stacking the semiconductor chips or semiconductor packages, etc., are being studied.

Especially, a method associated with a semiconductor memory chip allows leads, that is, 16n bare I/0 pins, to be connected in parallel for increasing memory capacity. For this purpose, at least two leads of the same package are stacked, or two semiconductor chips are stacked to be encapsulated by a resin as one package body, and the like.

FIGS. 1A and 1B shows one example of a semiconductor package by a conventional method, wherein FIG. 1A is a plan view of the semiconductor package, and FIG. 1B is a cross-sectional view of the semiconductor package shown in FIG. 1A.

Referring to FIGS. 1A and 1B, semiconductor package 10 is a single-type package. A semiconductor chip 2 is mounted onto the upper portion of a die pad 1 while interposing an insulating adhesive 5 therebetween. Bonding pads (not shown) of the semiconductor chip 2 are bonded to inner leads of leads 3 by means of wires 4, and an EMC is used to mold the resultant structure to form a package body 6.

The above described semiconductor package 10 has a surface mounting package structure of dual-in line package (DIP)-type or a quad-flat package (QFP)-type, in which an outer lead externally projecting from the package body 6 is provided in the mounting direction, a mounting connection portion is attached on the upper portion of a lead frame by means of an adhesive, and respective inner leads electrically corresponding to respective semiconductor chip pads are connected by means of metal wires, thereby completing the semiconductor package 10 through the molding with the EMC.

However, the above-described semiconductor package is suitable for mounting a small scale semiconductor chip, but cannot be applied to mounting a large scale semiconductor chip.

FIGS. 2A and 2B illustrate another example of a conventional semiconductor package, wherein FIG. 2A is a plan view showing the semiconductor package, and FIG. 2B is a cross-sectional view showing the semiconductor package illustrated in FIG. 2A.

Referring to FIGS. 2A and 2B, the semiconductor package 20 has a semiconductor chip 12 directly mounted onto a plurality of leads 13 through the LOC method. Here, the semiconductor chip 12 is attached to the plurality of leads 13 by interposing insulating adhesive tapes 11, and a bonding pad portion (not shown) of the semiconductor chip 12 is connected to the leads 13 by means of metal wires 14. Finally, the package body 16 is formed by the molding with the EMC.

The semiconductor package 20 is advantageous in that the semiconductor chip is directly mounted to the inner leads without using the die pad, thereby increasing the mounting efficiency of the semiconductor chip. However, as explained with reference to FIG. 1, it is difficult to increase the efficiency of the PCB mounting when mounting the semiconductors package on the PCB.

SUMMARY OF THE INVENTION

The present invention is devised to solve the above-described problems. Accordingly, it is an object of the present invention to provide a stacked semiconductor device manufacturing method for attaining high density mounting, wherein a plurality of leads are arranged to transversely coincide with each other at an inner lead portion, and at least two insulating adhesive portions are interposed on the inner lead portion to mount and attach at least two semiconductor chips.

It is another object of the present invention to provide a stacked semiconductor device manufacturing method for attaining high density mounting, wherein a metal pattern including an inner lead portion and outer lead portion is formed on insulating tapes and a metal bump is formed on the inner lead portion to attach a plurality of semiconductor chips via a thermo-compression method.

It is still another object of the present invention to provide a stacked semiconductor package, wherein a package body is formed by alternately arranging inner leads of both direction leads to face each other for attaching semiconductor chips by interposing an adhesive, and bonding a bonding pad portion of the semiconductor chip to the inner lead by means of wire bonding in the diagonal direction prior to being encapsulated with a resin.

To achieve the above objects according to the present invention, there is provided a method for manufacturing a stacked semiconductor device having at least one semiconductor chip mounted via a lead on chip method, in which leads are alternately arranged to partially coincide with each other in the transversal direction, at least two semiconductor chips are mounted to be attached onto the upper portion of the inner leads by interposing insulating adhesive members, bonding pads of the semiconductor chips are wire bonded to the inner leads by means of silver wires or gold wires which are inclined by a predetermined angle, and the resultant structure is molded with an epoxy mold compound to form a package body.

To achieve another object of the present invention, there is provided a method for manufacturing a stacked semiconductor device having at least one semiconductor chip mounted via a tape automated bonding, in which a metal wiring pattern is formed while including inner leads and outer leads insulating tapes, metal bumps are formed on the upper portions of the inner leads, a plurality of semiconductor chips are mounted on the metal bumps, and the metal bumps are attached onto the upper portions of the inner leads and bonding pads of the semiconductor chips via a thermo-compression method, and the resultant structure is encapsulated with a resin to protect the semiconductor chips.

To achieve still another object of the present invention there is provided a semiconductor package formed by mounting a plurality of semiconductor chips on the upper or lower portion of leads of a lead frame by interposing adhesives, and wire bonding bonding pads of the semiconductor chips to inner leads of the lead frame prior to being molded with an epoxy mold compound, in which the leads are alternately arranged to partially coincide with each other in the transversal direction, the adhesives are coated on the lower portion for mounting at least two semiconductor chips, the leads and bonding pads of the semiconductor chips are wire bonded by wires being inclined, and the wire bonded portion and the semiconductor chips are protected by being molded.

BRIEF DESCRIPTION OF THE DRAWINGS

The above objects and other advantages of the present invention will become more apparent by describing in detail preferred embodiments thereof with reference to the attached drawings in which:

FIGS. 1A and 1b illustrate an embodiment of a semiconductor package made by a conventional technique, wherein FIG. 1A is a plan view showing the semiconductor package, and FIG. 1B is a cross-sectional view showing the semiconductor package of FIG. 1A;

FIGS. 2A and 2B illustrates another example of a semiconductor package made by a conventional technique, wherein FIG. 2A is a plan view showing the semiconductor package, and FIG. 2B is a cross-sectional view showing the semiconductor package of FIG. 2A;

FIGS. 5A and 5b are views showing semiconductor packages mounted onto a PCB, wherein FIG. 5A shows the mounting of the conventional semiconductor package, and FIG. 5B shows the mounting of the semiconductor package according to the present invention.

DETAILED DESCRIPTION OF THE INVENTION

Figure 1A:
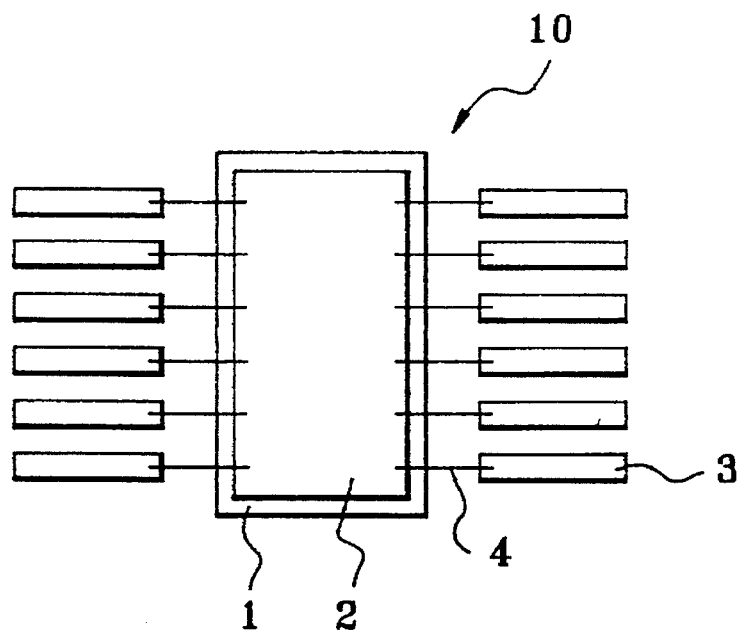
Figure 1B:
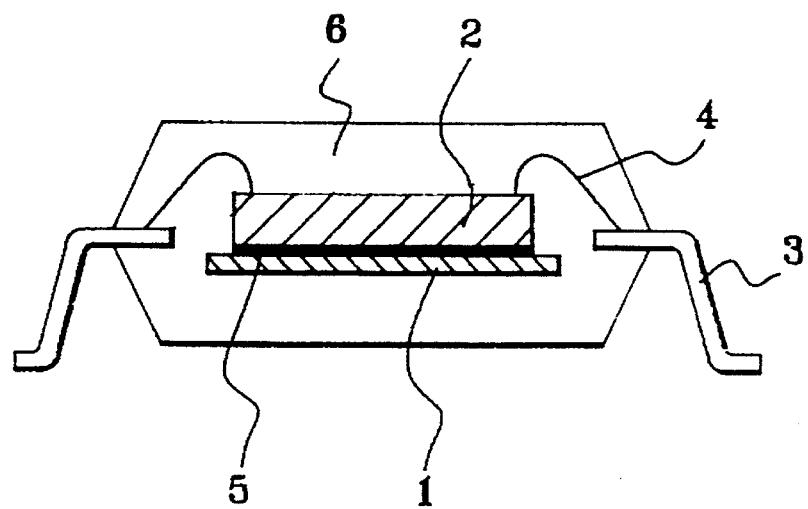
Figure 2A:
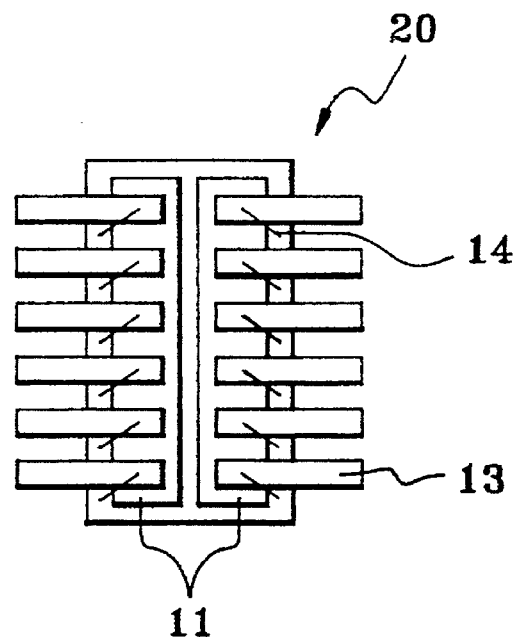
Figure 2B:
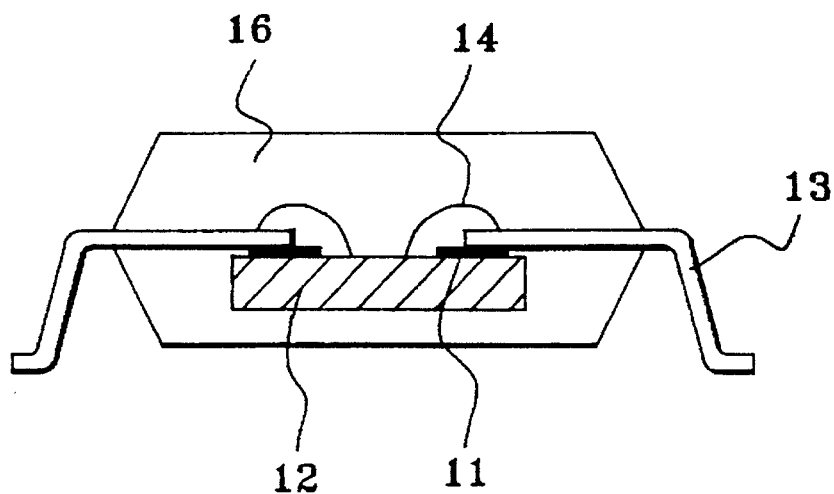
Figure 3A:
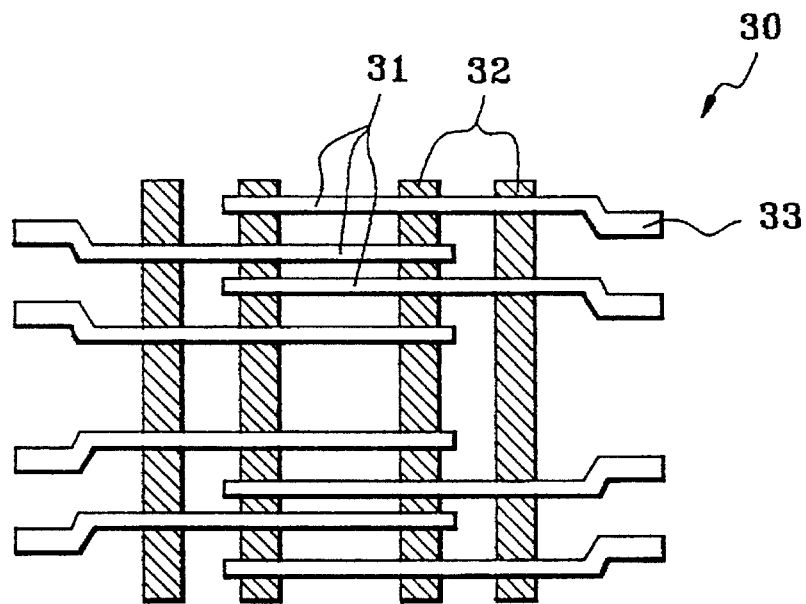
FIGS. 3A and 3B show an embodiment of a process for manufacturing a stacked semiconductor device according to the present invention.
Figure 3B:
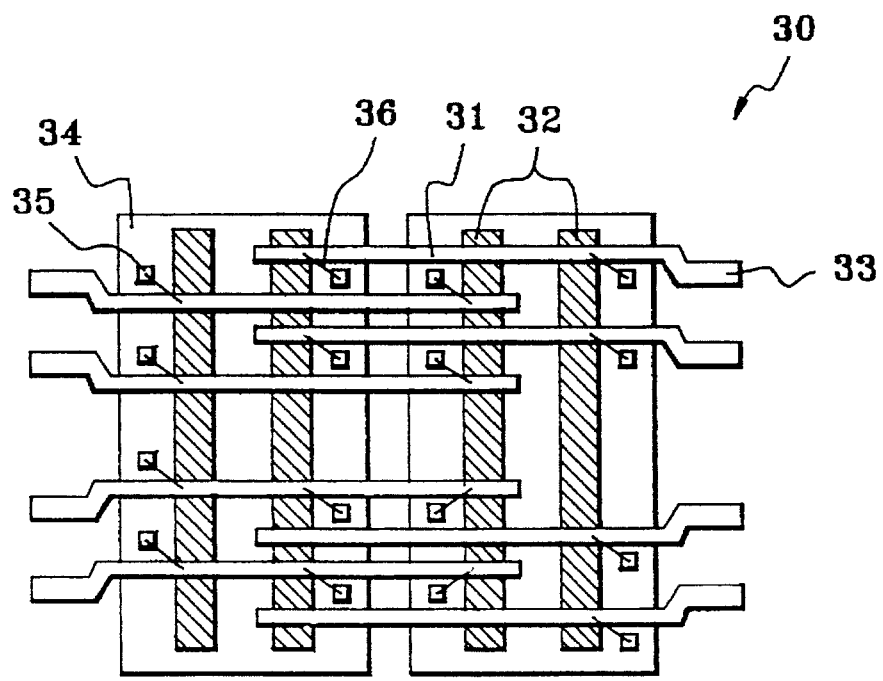

FIGS. 3A and 3B illustrate a process of manufacturing a stacked semiconductor package according to the present invention. Stacked semiconductor device 30 according to the present invention will be described in detail.

Inner leads 31 of leads 33 are alternately arranged to partially coincide with each other from opposite directions by at least two or more. At least two double-sided insulating adhesive tapes 32 are adhered as a set on an upper portion of the inner leads 31 to fix the leads 33, then semiconductor chips 34 are mounted onto the adhesive tapes 32.

Bonding pads 35 of the semiconductor chips 34 are electrically connected to the inner leads 31 by bonding with inclined wires 36 of, for example, silver or gold. Then, the package body 30 is formed by encapsulating with EMC to protect the wire bonded area and the semiconductor chip area. The above process is, for example, executed by the LOC mounting method.

Even though not illustrated in drawings, another preferred embodiment of the stacked semiconductor device manufacturing method may use the TAB method described as below.

First, device holes for mounting semiconductor chips are formed in both sides of a base film of an insulating material such as polyimide, polyester, polyether-sulfone (PES) and polyparaanic acid (PPA) through a punching process.

A thin metal film of copper, etc., in the thickness of about 18–35 μm attached on the base film is photolithographed to form a metal wiring including inner leads and outer leads Melted solder is dropped on the ends of the inner leads to form metal bumps having good electrical conductive property. A plurality of semiconductor chips are mounted on the metal bumps, and then attached to be electrically connected to the metal wiring leads via a thermo-compression method. Then, the bumped semiconductor chips are encapsulated by a package body to protect them.

One embodiment of a semiconductor package manufactured by the above-stated methods will be described hereinbelow.

Figure 4:
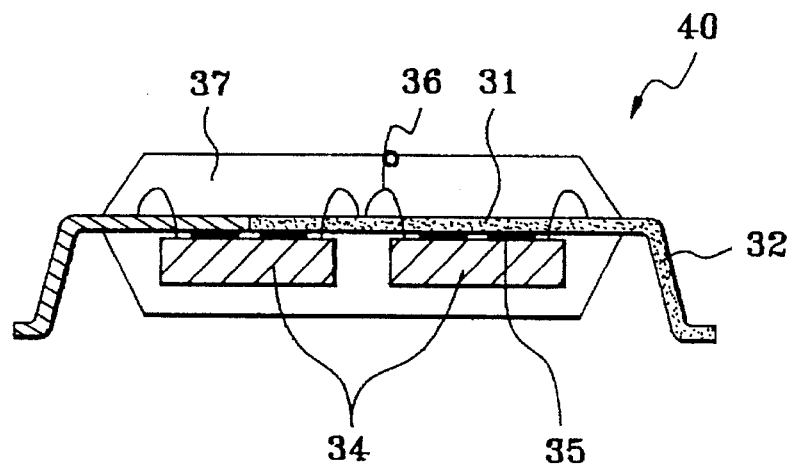
FIG. 4 is a cross-sectional view showing the stacked semiconductor package according to the present invention.

FIG. 4 is a cross-sectional view showing the stacked semiconductor package 40 according to the present invention.

Leads including inner leads 31 and outer leads 32 of a lead frame are alternately arranged to be partially coincidental with each other in the transversal direction (not shown).

Double-sided insulating adhesives 35 are applied under the inner leads 31 to mount at least two semiconductor chips 34.

One bonding pad on the left upper portion of the semiconductor chip 34 mounted on the inner lead 31 is bonded to the inner lead 31 by a inclined wire 36 of a metal line and the other bonding pad on the right upper portion of the semiconductor chip 34 is bonded by means of the inclined wire 36 of a metal line (refer to FIG. 3B).

After transversely wire bonding the inner leads 31 and the bonding pads of the semiconductor chips 34, a package body 37 is formed by molding with EMC to protect the wire bonded portions and semiconductor chips.

Figure 5A:
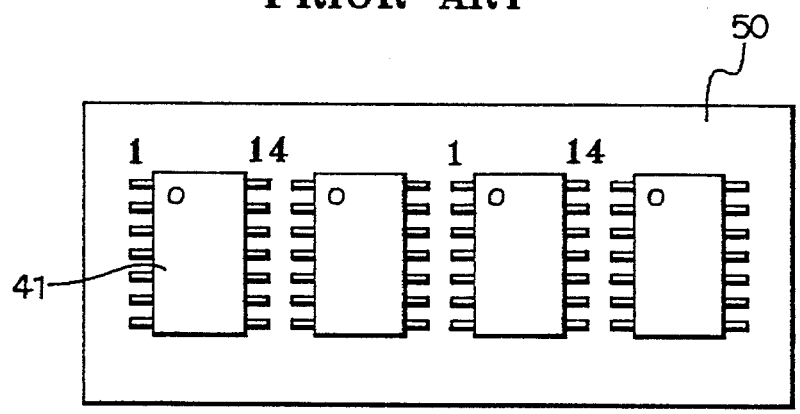
Figure 5B:
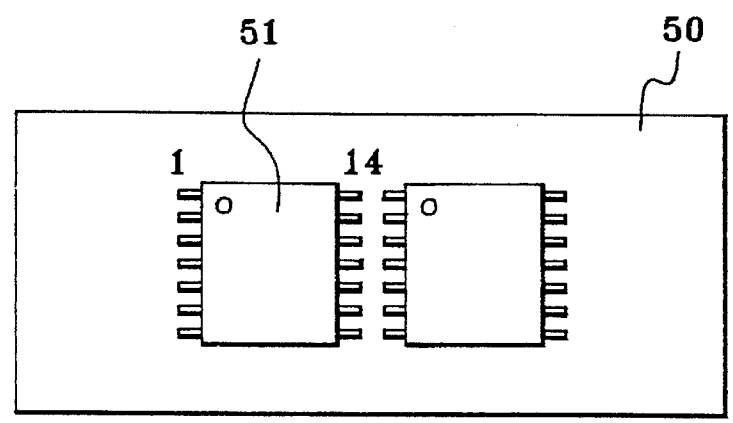

FIGS. 5A and 5B are views showing semiconductor packages mounted onto a PCB, wherein FIG. 5A shows the mounting of the conventional semiconductor package, and FIG. 5B shows the mounting of the semiconductor package according to the present invention.

At this time, FIG. 5A illustrates four semiconductor packages 41 mounted on a PCB 50 by a conventional method with one chip each while FIG. 5B illustrates two semiconductor packages 51 are mounted on the PCB 50 according to the present invention with at least two chips each. Accordingly, increased PCB mounting efficiency can be easily recognized.

As a result, in a stacked semiconductor device manufacturing method and a semiconductor package according to the present invention, a plurality of semiconductor chips can be carried within a single package in large scale semiconductor devices. It further improves package density and information transmission speed by reducing the spacing of wiring. In addition, there are advantages of decreasing the number of land patterns on the PCB, and simplifying PCB design to allow a single chip package to be a module.

Since the present invention enables manufacturing of semiconductor packages via the LOC or TAB method, it will be understood by those skilled in the art that various changes in form and details may be effected therein without departing from the spirit and scope of the invention as defined by the appended claims.

What is claimed is:

1. A method for manufacturing a semiconductor chip package including at least two semiconductor chips mounted via a lead on chip method, the method comprising the steps of:

providing a lead frame having first and second sets of leads on opposite sides of the lead frame, the first set of leads and the second set of leads extending in opposite directions, wherein at least end portions of the first and second sets of leads, respectively, are alternately arranged;

mounting at least two semiconductor chips on the first and second sets of leads, such that the at least two semiconductor chips are substantially coplanar, the at least two semiconductor chips each having bonding pads provided thereon;

electrically connecting the at least two semiconductor chips to respective leads of the first and second sets of leads, and electrically connecting at least one lead among the first and second sets of leads to each of the at least two semiconductor chips; and encapsulating the at least two semiconductor chips and a portion of the first and second sets of leads with a molding compound.

2. A method as claimed in claim 1, wherein said step of electrically connecting the at least two semiconductor chips to the first and second sets of leads comprises connecting one bonding pad to a respective lead from among the first and second sets of leads with a wire, wherein the one bonding pad is offset from the respective lead, whereby the wire connecting the one bonding pad and the respective lead extends obliquely relative to the respective lead.

3. A method as claimed in claim 1, wherein said mounting step comprises adhesively mounting the at least two semiconductor chips using an insulating adhesive interposed between the at least two semiconductor chips and the first and second sets of leads.

4. A semiconductor chip package comprising:

a lead frame having first and second sets of leads at opposite sides of said lead frame, said first and second sets of leads extending in opposite directions, wherein at least end portions of said first set of leads are alternately arranged relative to at least end portions of said second set of leads;

at least two semiconductor chips each having bonding pads and being mounted on said first and second sets of leads so as to be substantially coplanar with one another, said at least two semiconductor chips being each electrically connected to said first and second sets of leads, wherein at least one lead among said first and second sets of leads is electrically connected to each of said at least two semiconductor chips; and a package body encapsulating said at least two semiconductor chips and a portion of said first and second sets of leads.

5. A semiconductor chip package as claimed in claim 4, wherein said at least two semiconductor chip packages are electrically connected to said first and second sets of leads with wiring.

6. A semiconductor chip package as claimed in claim 4, wherein said at least two semiconductor chip packages are electrically connected to said first and second sets of leads with wiring connecting respective leads of said first and second sets of leads and corresponding bonding pads on said at least two semiconductor chips.

7. A semiconductor chip package as claimed in claim 6, wherein a respective bonding pad connected to a respective lead is offset from said respective lead, whereby said wiring connecting said respective bonding pad and said respective lead extends obliquely relative to said respective lead.

8. A semiconductor chip package as claimed in claim 4, wherein said package body is made from an epoxy molding compound.

9. A semiconductor chip package as claimed in claim 5, wherein said wiring is made from gold.

10. A semiconductor chip package as claimed in claim 5, wherein said wiring is made from silver.

11. A semiconductor chip package as claimed in claim 4, wherein said at least two semiconductor chips are adhesively mounted with an insulating adhesive interposed between said at least two semiconductor chips and said first and second sets of leads.

12. A method as claimed in claim 2, wherein said step of electrically connecting further comprises using silver wire.

13. A method as claimed in claim 2, wherein said step of electrically connecting further comprises using a gold wire.

14. A method as claimed in claim 1, wherein said encapsulating step is performed using an epoxy molding compound.

* * * * *